United States Patent
Lochtman et al.

(10) Patent No.: US 8,247,320 B2
(45) Date of Patent: Aug. 21, 2012

(54) PROCESS FOR PRODUCING ELECTRODES FOR SOLAR CELLS

(75) Inventors: Rene Lochtman, Mannheim (DE); Norbert Wagner, Mutterstadt (DE); Jürgen Kaczun, Wachenheim (DE); Jürgen Pfister, Speyer (DE)

(73) Assignee: BASF SE, Ludwigshafen (DE)

( * ) Notice: Subject to any disclaimer, the term of this patent is extended or adjusted under 35 U.S.C. 154(b) by 0 days.

(21) Appl. No.: 12/999,329

(22) PCT Filed: Jun. 9, 2009

(86) PCT No.: PCT/EP2009/057103
§ 371 (c)(1), (2), (4) Date: Mar. 7, 2011

(87) PCT Pub. No.: WO2009/153192
PCT Pub. Date: Dec. 23, 2009

(65) Prior Publication Data
US 2011/0151614 A1    Jun. 23, 2011

(30) Foreign Application Priority Data
Jun. 18, 2008 (EP) .................... 08158506

(51) Int. Cl.
*H01L 21/44* (2006.01)
(52) U.S. Cl. .................. 438/610; 438/57; 257/E21.477
(58) Field of Classification Search .......... 438/609, 438/610, 650, 676; 257/E21.045, E21.061, 257/E21.471, E21.477, E21.536
See application file for complete search history.

(56) References Cited

U.S. PATENT DOCUMENTS

| 4,375,007 A | 2/1983 | Marcus |
| 6,177,151 B1 | 1/2001 | Chrisey et al. |
| 2005/0191511 A1* | 9/2005 | Aoki et al. .................... 428/621 |
| 2006/0281846 A1 | 12/2006 | Hager et al. |
| 2007/0169806 A1 | 7/2007 | Fork et al. |
| 2007/0187652 A1 | 8/2007 | Konno |
| 2009/0285976 A1 | 11/2009 | Lochtman et al. |
| 2009/0314344 A1 | 12/2009 | Fork et al. |
| 2010/0021657 A1 | 1/2010 | Lochtman et al. |

FOREIGN PATENT DOCUMENTS

| DE | 37 02 643 | 8/1987 |
| DE | 100 51 850 | 10/2001 |
| DE | 10 2006 033 887 | 1/2008 |

(Continued)

OTHER PUBLICATIONS

International Search Report issued Sep. 29, 2010 in PCT/EP09/57103 filed Jun. 9, 2009.

(Continued)

*Primary Examiner* — Cheung Lee
(74) *Attorney, Agent, or Firm* — Oblon, Spivak, McClelland, Maier & Neustadt, L.L.P.

(57) ABSTRACT

The invention relates to a process for producing electrodes for solar cells, the electrode being configured as an electrically conductive layer on a substrate for solar cells, in which, in a first step, a dispersion comprising electrically conductive particles is transferred from a carrier to the substrate by irradiating the dispersion with a laser and, in a second step, the dispersion transferred to the substrate is dried and/or hardened to form the electrically conductive layer.

19 Claims, 1 Drawing Sheet

FOREIGN PATENT DOCUMENTS

| | | |
|---|---|---|
| EP | 1 833 099 | 9/2007 |
| EP | 1 911 584 | 4/2008 |
| WO | 99 44402 | 9/1999 |
| WO | 2005 084955 | 9/2005 |
| WO | 2007 144322 | 12/2007 |
| WO | 2008 021782 | 2/2008 |
| WO | 2008 080893 | 7/2008 |

OTHER PUBLICATIONS

U.S. Appl. No. 13/140,544, filed Jun. 17, 2011, Kleine Jaeger, et al.
U.S. Appl. No. 13/140,530, filed Jun. 17, 2011, Kleine Jaeger, et al.

* cited by examiner

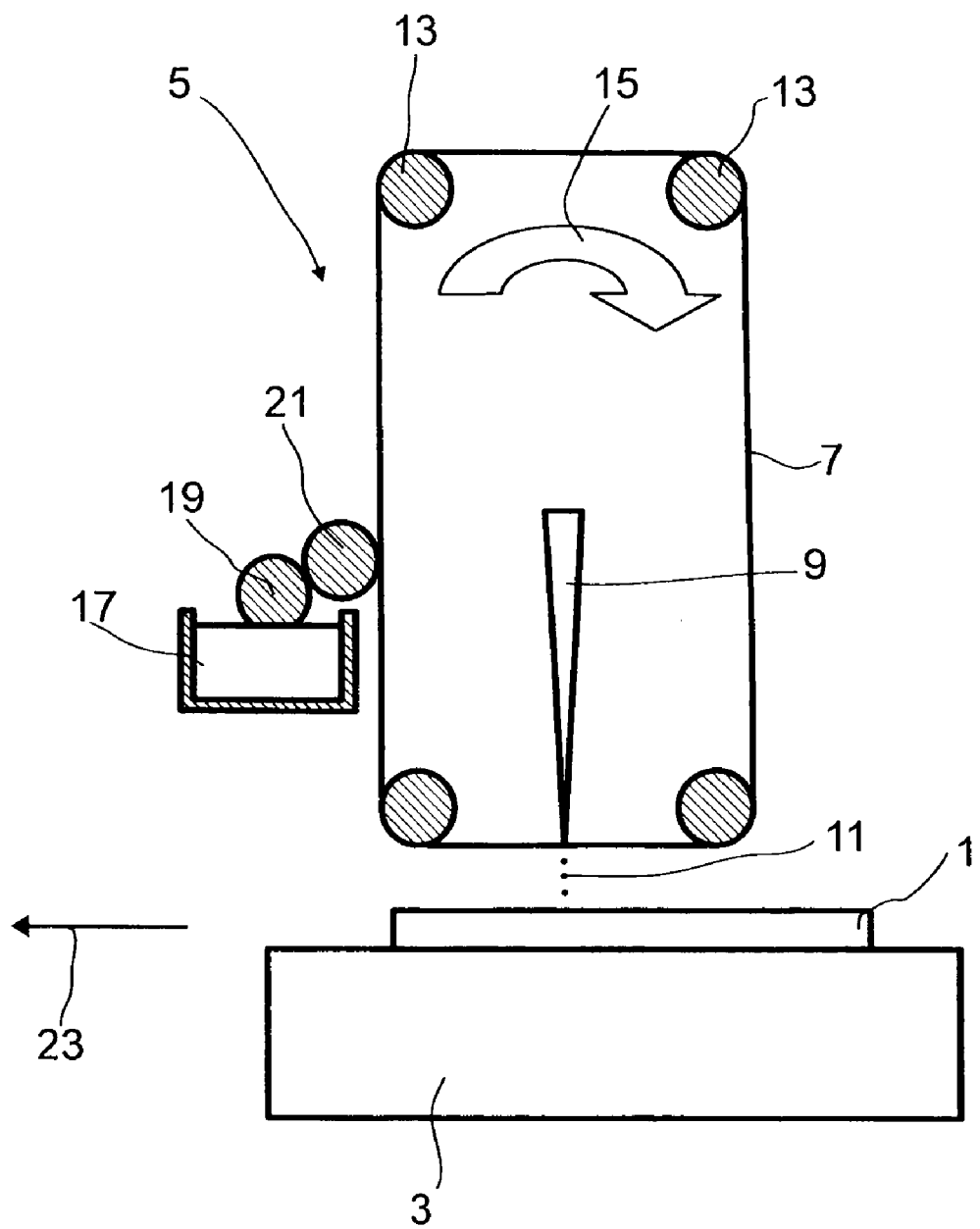

PROCESS FOR PRODUCING ELECTRODES FOR SOLAR CELLS

BACKGROUND OF THE INVENTION

The invention relates to a process for producing electrodes for solar cells, the electrode being configured as an electrically conductive layer on a substrate for solar cells.

Solar cells comprise generally a semiconductor substrate with a number of p- and n-doped regions which generate a potential difference and a voltage with one another when they are exposed to sunlight. In order to be able to draw off the voltage, electrodes are applied to the surfaces of the semiconductor substrate. At present, the electrodes are generally applied in a screenprinting process. The production of electrodes in a screenprinting process is described, for example, in EP-A 1 911 584, US-A 2007/0187652 or U.S. Pat. No. 4,375,007.

As an alternative, for example, WO 2008/021782 discloses first applying a metal layer to the semiconductor material, applying a covering resist by an inkjet printing process, which covers the regions which are to form the structure of the electrodes, and then removing the uncovered regions of the metal layer by an etching process. Subsequently, the covering resist is removed again.

The introduction of contact orifices into a passivation layer on a semiconductor substrate, for example by means of laser-based systems, is described in EP-A 1 833 099. After the introduction of the contact orifices, a direct-writing metalization process introduces a metal into the contact orifices. Examples of direct-writing metalization processes mentioned are inkjet processes or extrusion processes. Finally, a high-conductivity material is applied to the contact material deposited beforehand and between the contacting orifices.

DE-A 10 2006 033 887 discloses applying an electrically conductive layer to a substrate, by transferring a transfer layer comprising an electrically conductive polymer from a transfer film to the substrate.

One disadvantage of the printing and embossing processes known from the prior art is that printing resolution is limited especially in the case of screenprinting, and conductor tracks with a width of less than 120 μm cannot be printed. Efficient power generation in solar cells, however, requires a maximum usable surface area, which is why it is desirable also to print conductor track structures with smaller dimensions.

A further disadvantage of the printing and embossing processes is that they do not proceed contactlessly and the substrate can fracture owing to the pressure applied by the contact, for example with screen and blade in the course of screenprinting. In contactless processes, no pressure is exerted on the substrate, and so the risk of fracture of the substrate is significantly reduced. The contactless processes known from the prior art are generally etching processes, which have the disadvantage that acids and alkalis have to be used for the etching and subsequent removal of the covering resist. In addition, several complicated process steps are required.

SUMMARY OF THE INVENTION

It is an object of the invention to provide a process for producing electrodes for solar cells, the electrode being configured as a electrically conductive layer, which enables the electrically conductive layer also to be reproduced in very fine structures and which can be performed in a simple manner with the use of large amounts of environmentally hazardous substances.

The object is achieved by a process for producing electrodes for solar cells, the electrode being configured as an electrically conductive layer on a substrate for solar cells, which comprises the following steps:
a) transferring a dispersion comprising electrically conductive particles from a carrier to the substrate by irradiating the dispersion with a laser,
b) drying and/or hardening the dispersion transferred to the substrate to form the electrically conductive layer.

Suitable substrates for the solar cell to which the electrically conductive layer is applied are, for example, all rigid or flexible substrates which are suitable for producing solar cells. Suitable substrates are, for example, monocrystalline, multicrystalline or amorphous silicon, III-V semiconductors, for example GaAs, GaSb, GaInP, GaInP/GaAs, GaAs/Ge, or II-VI semiconductors, for example CdTe, or semiconductors, for example $CuInS_2$, $CuGaSe_2$, or those of the general formula $ABC_2$ where A is copper, silver, gold, B is aluminum, gallium or indium, and C is sulfur, selenium or tellurium.

Additionally suitable are all rigid or flexible substrates which are coated with the aforementioned semiconductor materials. Such rigid and flexible substrates are, for example, glass or polymer films.

In a first step, a dispersion which comprises electrically conductive particles is transferred from a carrier to the substrate. The transfer is effected by irradiation of the dispersion on the carrier with a laser.

The electrically conductive layer which is applied to the substrate may cover the whole surface or be structured. Transfer of the dispersion with the laser also allows very fine structures to be obtained, for example with dimensions of less than 120 μm, preferably of less than 100 μm, especially of less than 80 μm. These dimensions relate in particular to the width of individual tracks.

Before the dispersion with the electrically conductive particles present therein is transferred, it is preferably applied to the support over the whole surface. Alternatively, it is of course also possible that the dispersion is applied to the carrier in a structured manner. However, preference is given to application of the dispersion over the whole surface.

Suitable carriers are all materials transparent to the particular laser radiation, for example plastic or glass. For example, in the case of use of IR lasers, it is possible to use polyolefin films, PET films, polyimide films, polyamide films, PEN films, polystyrene films or glass.

The carrier may be either rigid or flexible. In addition, the carrier may be present as a tube or continuous film, sleeve or as a flat carrier.

Suitable laser sources for generating the laser beam are commercially available. It is possible in principle to use all laser beam sources. Such laser beam sources are, for example, pulsed or continuous gas, fiber, solid state, diode or excimer lasers. These can be used in each case provided that the particular carrier is transparent to the laser radiation, and the dispersion which comprises the electrically conductive particles and has been applied to the carrier sufficiently absorbs the laser radiation in order to generate a cavitation bubble in the electrically conductive layer as a result of conversion of light to thermal energy.

Preference is given to using, as the laser source, pulsed or continuous (cw) IR lasers, for example Nd:YAG lasers, Yb:YAG lasers, fiber lasers or diode lasers. These are inexpensive and available at high power. Particular preference is given to continuous (cw) IR lasers. Depending on the absorption capacity of the dispersion which comprises the electrically conductive particles, it is, however, also possible to use lasers with wavelengths in the visible range or in the UV frequency range. Suitable lasers for this purpose are, for example, Ar lasers, HeNe lasers, frequency-multiplied IR solid-state lasers or excimer lasers, such as ArF lasers, KrF lasers, XeCl lasers or XeF lasers. Depending on the laser beam source, the laser power and the optics and modulators used, the focus diameter of the laser beam is in the range between 1 µm and 100 µm.

The wavelength of the laser beam that the laser generates is preferably within the range from 150 to 10 600 nm, especially within the range from 600 to 10 600 nm.

To generate the structure of the electrically conductive layer, it is also possible to arrange a mask in the beam path of the laser or to employ an imaging process known to those skilled in the art.

In a preferred embodiment, the desired parts of the dispersion which has been applied to the carrier and comprises the electrically conductive particles are transferred to the substrate by means of a laser focused onto the dispersion.

To perform the process according to the invention, the laser beam and/or the carrier and/or the substrate can be moved. The laser beam can, for example, be moved by optics known to those skilled in the art with rotating mirrors. The carrier can, for example, be configured as a rotating continuous film which is coated continuously with the dispersion comprising the electrically conductive particles. The substrate can be moved, for example, by means of an XY stage or as a continuous film with unwinding and winding device.

The dispersion which is transferred from the carrier to the substrate generally comprises electrically conductive particles in a matrix material. The electrically conductive particles may be particles of any desired geometry composed of any desired electrically conductive material, composed of mixtures of different electrically conductive materials or else composed of mixtures of electrically conductive and nonconductive materials. Suitable electrically conductive materials are, for example, carbon such as carbon black, graphite, graphenes or carbon nanotubes, electrically conductive metal complexes or metals. Preferably, nickel, copper, silver, gold, aluminum, titanium, palladium, platinum, and alloys thereof, or metal mixtures which comprise at least one of these metals, are present. Especially preferred are aluminum, copper, nickel, silver, titanium, carbon and mixtures thereof.

The electrically conductive particles preferably possess a mean particle diameter of from 0.001 to 100 µm, preferably from 0.002 to 50 µm and especially preferably from 0.005 to 15 µm. The mean particle diameter can be determined by means of laser diffraction measurement, for example on a Microtrac X100 instrument. The distribution of the particle diameters depends on the preparation process thereof. Typically, the diameter distribution has only one maximum, though several maxima are also possible. In order to achieve particularly tight packing of the particles, preference is given to using different particle diameters. For example, particles with a mean particle diameter of more than 1 µm may be mixed with nanoparticles having a mean particle diameter of less than 100 nm.

The surface of the electrically conductive particles may be provided at least partly with a coating. Suitable coatings may be of inorganic or organic nature. Inorganic coatings are, for example, $SiO_2$. It will be appreciated that the electrically conductive particles may also be coated with a metal or metal oxide. The metal may likewise be present in partly oxidized form.

When two or more different metals are to form the electrically conductive particles, this can be done by means of a mixture of these metals. It is especially preferred when the metals are selected from the group consisting of aluminum, silver, copper, nickel, titanium, platinum and palladium.

However, the electrically conductive particles may also comprise a first metal and a second metal, in which case the second metal is present in the form of an alloy with the first metal or one or more other metals, or the electrically conductive particles comprise two different alloys.

In addition to the selection of the electrically conductive particles, the shape of the particles has an influence on the properties of the dispersion after coating. With regard to the shape, numerous variants known to those skilled in the art are possible. The shape of the electrically conductive particles may, for example, be acicular, cylindrical, platelet-shaped or spherical. These particle shapes constitute idealized shapes, from which the actual shape, for example as a result of preparation, can deviate to a greater or lesser degree. For example, droplet-shaped particles are a real deviation from the idealized spherical shape in the context of the present invention.

The electrically conductive particles with various particle shapes are commercially available.

When mixtures of electrically conductive particles are used, the individual mixture components may also possess different particle shapes and/or particle sizes. It is also possible to use mixtures of only one type of electrically conductive particles with different particle sizes and/or particle shapes. In the case of different particle shapes and/or particle sizes, preference is likewise given to the metals aluminum, silver, copper, nickel, titanium, platinum and palladium, and also carbon.

When mixtures of particle shapes are used, preference is given to mixtures of spherical particles with platelet-shaped particles. In one embodiment, for example, spherical silver particles are used with platelet-shaped silver particles and/or carbon particles of other geometries. In an alternative embodiment, spherical silver particles are combined with platelet-shaped aluminum particles.

As already detailed above, the electrically conductive particles can be added to the dispersion in the form of their powders. Such powders, for example metal powders, are common commercial products and can be produced easily by means of known processes, for instance by electrolytic deposition or chemical reduction from solutions of metal salts or by reduction of an oxidic powder, for example by means of hydrogen, by spraying or jetting a metal melt, especially into cooling media, for example gases or water. Preference is given to gas and water jetting, and to the reduction of metal oxides. Metal powders of the preferred particle size can also be prepared by grinding coarser metal powders. A ball mill, for example, is suitable for this purpose.

Platelet-shaped electrically conductive particles can be controlled by optimized conditions in the preparation process or be obtained subsequently by mechanical treatment, for example by treatment in a stirred ball mill.

Based on the total weight of the dried coating, the proportion of electrically conductive particles is in the range from 20 to 98% by weight. A preferred range of the content of electrically conductive particles is from 30 to 95% by weight based on the total weight of the dried coating.

Suitable matrix materials are, for example, binders with an anchor group having pigment affinity, natural and synthetic polymers and derivatives thereof, natural resins and synthetic resins and derivatives thereof, natural rubber, synthetic rubber, proteins, cellulose derivatives, drying and nondrying oils and the like. These may—but need not—be chemically or physically curing, for example air-curing, radiation-curing or temperature-curing.

The matrix material is preferably a polymer or polymer mixture.

Polymers preferred as matrix material are ABS (acrylonitrile-butadiene-styrene); ASA (acrylonitrile-styrene-acrylate); acrylated acrylates; alkyd resins; alkylvinyl acetates; alkylene-vinyl acetate copolymers, in particular methylene-vinyl acetate, ethylene-vinyl acetate, butylene-vinyl acetate; alkylene-vinyl chloride copolymers; amino resins; aldehyde resins and ketone resins; cellulose and cellulose derivatives, in particular hydroxyalkylcellulose, cellulose esters, such as cellulose acetates, cellulose propionates, cellulose butyrates, carboxyalkylcelluloses, cellulose nitrate; ethylcellulose, methylcellulose, epoxy acrylates; epoxy resins; modified epoxy resins, e.g. bifunctional or polyfunctional bisphenol A or bisphenol F resins, epoxy-novolac resins, brominated epoxy resins, cycloaliphatic epoxy resins; aliphatic epoxy resins, glycidic ethers, vinyl ethers, ethylene-acrylic acid copolymers; hydrocarbon resins; MABS (transparent ABS comprising acrylate units); melamine resins, maleic anhydride copolymers; methacrylates; natural rubber; synthetic rubber; chlorinated rubber; natural resins; rosins; shellac, phenolic resins; polyesters; polyester resins, such as phenyl ester resins; polysulfones; polyether sulfones; polyamides; polyimides; polybutylene terephthalate (PBT); polycarbonate (for example Makrolon® from Bayer AG); polyester acrylates; polyether acrylates; polyethylene; polyethylene-thiophenes; polymethyl methacrylate (PMMA); polyphenylene oxide (PPO); polystyrenes (PS); polyvinyl compounds, in particular polyvinyl chloride (PVC), PVC copolymers, PVdC, polyvinyl acetate, and also their copolymers, if appropriate partially hydrolyzed polyvinyl alcohol, polyvinyl acetals, polyvinyl acetates, polyvinylpyrrolidone, polyvinyl ethers, polyvinyl acrylates and polyvinyl methacrylates in solution and as dispersion, and also their copolymers, polyacrylates and polystyrene copolymers; polystyrene (impact-modified or non-impact-modified); polyurethanes, uncrosslinked or crosslinked with isocyanates; polyurethane acrylates; styrene-acrylic copolymers; styrene-butadiene block copolymers (for example Styroflex® or Styrolux® from BASF AG, K-Resin™ from CPC); proteins, e.g. casein; SIS triazine resin, bismaleimide-triazine resin (BT), cyanate ester resin (CE), allylated polyphenylene ether (APPE). Mixtures of two or more polymers can moreover form the matrix material.

Polymers particularly preferred as matrix material are acrylates, acrylate resins, cellulose derivatives such as cellulose ethers, e.g. methylcelluloses, ethylcelluloses, or cellulose esters, methacrylates, methacrylate resins, melamine and amino resins, polyalkylenes, polyimides, epoxy resins, modified epoxy resins, polyvinyl ethers, phenolic resins, polyurethanes, polyesters, polyvinyl-acetals, polyvinyl acetates, polyvinyl alcohols, polystyrenes, polystyrene copolymers, polystyrene acrylates, styrene-butadiene block copolymers, alkylene-vinyl acetates and vinyl chloride copolymers, polyamides, and also their copolymers.

Based on the total weight of the dry coating, the proportion of the organic binder component is from 0.01 to 60% by weight. The proportion is preferably from 0.1 to 45% by weight, more preferably from 0.5 to 35% by weight.

The dispersion comprising the electrically conductive particles may additionally comprise a glass frit. The proportion of glass frit, based on the dry coating, is preferably in the range from 0.1 to 15% by weight, preferentially in the range from 0.5 to 10% by weight and more preferably in the range from 1 to 5% by weight. The glass used for the glass frit has a softening point which is generally within the range from 450 to 550° C.

The glass frit added to the dispersion may comprise alkali metal oxides, for example $Na_2O$, $K_2O$, $Li_2O$, alkaline earth metal oxides, for example MgO, CaO, SrO or BaO, or further metal oxides, for example $B_2O_3$, $Bi_2O_3$, $Al_2O_3$, $SiO_2$, ZnO, $TiO_2$, $ZrO_2$, PbO, AgO or $WO_3$. The oxides may each be present in the glass frit individually or as a mixture of two or more oxides. When two or more oxides are present as a mixture in the glass frit, any desired mixing ratio of the individual oxides is possible.

In order to be able to apply the dispersion comprising the electrically conductive particles and the matrix material to the carrier, a solvent or a solvent mixture may additionally be added to the dispersion, in order to establish the viscosity of the dispersion which is suitable for the particular application process. Suitable solvents are, for example, aliphatic and aromatic hydrocarbons (for example n-octane, cyclohexane, toluene, xylene), alcohols (for example methanol, ethanol, 1-propanol, 2-propanol, 1-butanol, 2-butanol, amyl alcohol), polyhydric alcohols such as glycerol, ethylene glycol, propylene glycol, neopentyl glycol, alkyl esters (for example methyl acetate, ethyl acetate, propyl acetate, butyl acetate, isobutyl acetate, isopropyl acetate, 2,2,4-trimethyl-1,3-pentanediol monoisobutyrate), alkoxy alcohols (for example methoxypropanol, methoxybutanol, ethoxypropanol), alkylbenzenes (for example ethylbenzene, isopropylbenzene), butylglycol, butyldiglycol, alkylglycol acetates (for example butylglycol acetate, butyldiglycol acetate, propylene glycol methyl ether acetate), diacetone alcohol, diglycol dialkyl ethers, diglycol monoalkyl ethers, dipropylene glycol dialkyl ethers, dipropylene glycol monoalkyl ethers, diglycol alkyl ether acetates, dipropylene glycol alkyl ether acetate, dioxane, dipropylene glycol and ethers, diethylene glycol and ethers, DBE (dibasic esters), ethers (for example diethyl ether, tetrahydrofuran), ethylene chloride, ethylene glycol, ethylene glycol acetate, ethylene glycol dimethyl ester, cresol, lactones (for example butyrolactone), ketones (for example acetone, 2-butanone, cyclohexanone, methyl ethyl ketone (MEK), methyl isobutyl ketone (MIBK)), dimethylglycol, methylene chloride, methylene glycol, methylene glycol acetate, methylphenol (ortho-, meta-, para-cresol), pyrrolidones (for example N-methyl-2-pyrrolidone), propylene glycol, propylene carbonate, carbon tetrachloride, toluene, trimethylolpropane (TMP), aromatic hydrocarbons and mixtures, aliphatic hydrocarbons and mixtures, alcoholic monoterpenes (for example terpineol), water and mixtures of two or more of these solvents.

Preferred solvents are alcohols (for example ethanol, 1-propanol, 2-propanol, butanol), alkoxy alcohols (for example methoxypropanol, ethoxypropanol, butylglycol, dibutylglycol), butyrolactone, diglycol dialkyl ethers, diglycol monoalkyl ethers, dipropylene glycol dialkyl ethers, dipropylene glycol monoalkyl ethers, esters (for example ethyl acetate, butyl acetate, butyl glycol acetate, dibutyl glycol acetate, diglycol alkyl ether acetates, dipropylene glycol alkyl ether acetates, DBE, propylene glycol methyl ether acetate, 2,2,4-trimethyl-1,3-pentanediol monoisobutyrate), ethers (for example tetrahydrofuran, dioxane), polyhydric alcohols such as glycerol, ethylene glycol, propylene glycol, neopentyl glycol, ketones (for example acetone, methyl ethyl ketone, methyl isobutyl ketone, cyclohexanone), hydrocarbons (for example cyclohexane, ethyl benzene, toluene, xylene), N-methyl-2-pyrrolidone, water and mixtures thereof.

In the case of liquid matrix materials, the particular viscosity can alternatively also be established via the temperature in the course of application, or via a combination of solvent and temperature.

The dispersion may further comprise a dispersant component. This consists of one or more dispersants.

In principle, all dispersants which are known to those skilled in the art for use in dispersions and are described in the prior art are suitable. Preferred dispersants are surfactants or surfactant mixtures, for example anionic, cationic, amphoteric or nonionic surfactants. Cationic and anionic surfactants are described, for example, in "Encyclopedia of Polymer Science and Technology", J. Wiley & Sons (1966), volume 5, pages 816 to 818, and in "Emulsion Polymerisation and Emulsion Polymers", editors: P. Lovell and M. El-Asser, Verlag Wiley & Sons (1997), pages 224 to 226. However, it is also possible to use, as dispersants, polymers which have anchor groups with pigment affinity and are known to those skilled in the art.

The dispersant may, based on the total weight of the dispersion, be used in the range from 0.01 to 50% by weight. The proportion is preferably from 0.1 to 25% by weight, more preferably from 0.2 to 10% by weight.

In addition, it is possible to use further additives such as thixotropic agents, for example silica, silicates, for example aerosols or bentonites, or organic thixotropic agents and thickeners, for example polyacrylic acid, polyurethanes, hydrogenated castor oil, dyes, fatty acids, fatty acid amides, plasticizers, wetting agents, defoamers, lubricants, desiccants, crosslinkers, photoinitiators, complexing agents, waxes, pigments, conductive polymer particles.

The proportion of the filler and additive component based on the total weight of the dry coating is preferably from 0.01 to 50% by weight. Further preference is given to from 0.1 to 30% by weight, particular preference to from 0.3 to 20% by weight.

If the electrically conductive particles in the dispersion on the carrier do not sufficiently absorb the energy of the energy source, for example of the laser, absorbents can be added to the dispersion. According to the laser beam source used, it may be necessary to select different absorbents or else mixtures of absorbents which effectively absorb the laser radiation. The absorbent is either added to the dispersion or an additional separate absorption layer which comprises the absorbent is applied between the carrier and the dispersion. In the latter case, the energy is absorbed locally in the absorption layer and transferred to the dispersion by thermal conduction.

Suitable absorbents for laser radiation have a high absorption in the region of the laser wavelength. Especially suitable are absorbents which have a high absorption in the near infrared and in the longer-wave VIS region of the electromagnetic spectrum. Such absorbents are suitable especially for absorbing the radiation from high-power solid-state lasers, for example Nd-YAG lasers, and also from IR diode lasers. Examples of suitable absorbents for the laser radiation are dyes which absorb strongly in the infrared spectral region, for example phthalocyanines, naphthalocyanines, cyanines, quinones, metal complex dyes, such as dithiolenes, or photochromic dyes.

In addition, suitable absorbents are inorganic pigments, especially intensively colored inorganic pigments such as chromium oxides, iron oxides, iron oxide hydrates, or carbon in the form of, for example, carbon black, graphite, graphenes or carbon nanotubes.

Particularly suitable absorbents for laser radiation are finely divided carbon types and finely divided lanthanum hexaboride ($LaB_6$).

In general, from 0.005 to 20% by weight of absorbents based on the weight of the electrically conductive particles in the dispersion are used. Preference is given to using from 0.01 to 15% by weight of absorbents and particular preference to using from 0.1 to 10% by weight of absorbents, based in each case on the weight of the electrically conductive particles in the dispersion.

The amount of the absorbent added is selected by the person skilled in the art according to the properties of the dispersion layer desired in each case. In this connection, the person skilled in the art will also take into account that the absorbents added influence not only the speed and efficiency of the transfer of the dispersion by means of the laser, but also other properties, for example the adhesion of the dispersion on the carrier, the hardening or the electroless coatability and/or electrocoatability of the electrically conductive layer.

In the case of a separate absorption layer, this consists in the most favorable case of the absorbent and a thermally stable, if appropriate crosslinked material, such that it is not itself decomposed under the action of the laser light. In order to bring about effective conversion of light energy to thermal energy and to achieve poor thermal conduction into the electrically conductive layer, the absorption layer should be applied very thinly and the absorbent should be present in a very high concentration without adversely affecting the layer properties, for example the adhesion to the carrier. Suitable concentrations of the absorbent in the absorption layer are from 25 to 95% by weight, preferably from 50 to 85% by weight.

The energy which is required to transfer a portion of the dispersions comprising the electrically conductive particles can, depending on the laser used and/or the material from which the carrier has been produced, be applied either on the side coated with the dispersion or on the opposite side to the dispersion. If required, it is also possible to use a combination of the two process variants.

The transfer of the fractions of the dispersion from the carrier to the substrate can be carried out either on one side or two sides. In this case, the transfer may involve the two sides being coated with the dispersion successively or else, for example, simultaneously from both sides by using two laser sources and two carriers coated with the dispersion.

In order to increase the productivity, it is possible to use more than one laser source.

In a preferred embodiment of the process according to the invention, the transfer of the dispersion from the carrier to the substrate is preceded by applying the dispersion to the carrier. The application is effected, for example, by a coating process known to those skilled in the art. Suitable coating processes are, for example, casting, such as curtain casting, roller coating, spreading, knifecoating, brushing, spraying, dipping or the like. Alternatively, the dispersion comprising the electrically conductive particles is printed onto the carrier by any desired printing process. The printing process by which the dispersion is printed on is, for example, a roller or arc printing process, for example screenprinting, gravure printing, flexographic printing, letterpress printing, pad printing, inkjet printing, offset printing or magnetographic printing processes. However, any further printing process known to those skilled in the art is also usable.

In a preferred embodiment, the dispersion is not dried and/or hardened completely on the carrier, but rather transferred to the substrate in the wet state. This enables, for example, the use of a continuous printing unit, in which the dispersion on the carrier can be renewed constantly. This process regime allows a very high productivity to be achieved. Printing units which can be replenished continuously with ink are known to those skilled in the art, for example from DE-A 37 02 643. In order to prevent particles from sedimenting out of the dispersion, it is preferred when the dispersion is stirred and/or pumped in circulation in a reservoir vessel before being applied to the carrier. In addition, it is preferred for establishment of the viscosity of the dispersion when the temperature of the reservoir vessel in which the dispersion is present can be controlled.

In a preferred embodiment, the carrier is configured as a continuous belt which is transparent for the particular laser radiation, which is moved, for example, with internal transport rollers. Alternatively, it is possible to design the carrier as a cylinder, the cylinder being movable by means of internal transport rollers or being driven directly. The carrier is then coated with the dispersion comprising the electrically conductive particles, for example, by a process known to those skilled in the art, for example with a roller or a roller system from a reservoir vessel in which the dispersion is present. Rotation of the roller or of the roller system takes up the dispersion which is applied to the carrier. Movement of the carrier past the coating roller applies a full-area dispersion layer to the carrier. In order to transfer the dispersion to the substrate, the laser beam source is arranged in the interior of the continuous belt or of the cylinder. To transfer the dispersion, the laser beam is focused onto the dispersion layer and, through the carrier which is transparent thereto, hits the dispersion and transfers the dispersion to the substrate at the site at which it hits the dispersion. Such a printing unit is described, for example, in DE-A 37 02 643. The dispersion is transferred, for example, by virtue of the energy of the laser beam at least partly evaporating the dispersion and by virtue of the gas bubble which forms transferring the dispersion. The dispersion which is not transferred from the carrier to the substrate can be reused in a next coating step.

The layer thickness of the electrically conductive layer which is transferred to the substrate by means of the transfer by virtue of the laser varies preferably within the range between 0.01 and 50 μm, further preferably between 0.05 and 30 μm and especially between 0.1 and 20 μm. The electrically conductive layer may be applied either over the whole surface or in a structured manner.

Structured application of the dispersion to the carrier is advantageous when particular structures are to be produced in high numbers and the structured application reduces the amount of dispersion which has to be applied to the carrier. This allows less expensive production to be achieved.

In order to obtain a mechanically stable, structured or fully electrically conductive layer on the substrate, it is preferred that the dispersion with which the structured or fully electrically conductive layer is applied to the substrate is dried physically or hardened after the application. Depending on the matrix material, the drying or the curing is effected, for example, by the action of heat, light (UV/Vis) and/or radiation, for example infrared radiation, electron beams, gamma radiation, x-radiation, microwaves. To induce the hardening reaction, it may be necessary to add a suitable activator. The hardening can also be achieved by combining various processes, for example by combining UV radiation and heat. The combination of the hardening processes can be performed simultaneously or successively. For example, UV or IR radiation can initially be used merely to partially harden or partially dry the layer, such that the structures formed no longer flow away. Thereafter, the layer can be hardened or dried further by the action of heat.

When the substrate is heat-resistant, especially when the substrate does not comprise any polymer film, it is preferred to fire the substrate with the electrically conductive layer applied thereto, after the drying and/or hardening of the dispersion transferred to the substrate, to form the electrically conductive layer, in order to obtain a completely electrically conductive surface on the substrate and to establish contact with the active semiconductor layer of the substrate.

For the firing, the substrate with the electrically conductive layer applied thereto is brought to a temperature in the range from 600 to 900° C. in a gradient oven with a temperature profile adjusted to the particular formulation and the substrate for a period of generally from 30 s to 20 min. As a result, a portion of the metal of the electrically conductive layer begins to diffuse into the semiconductor material. The penetration depth of the metal into the substrate is adjusted through the temperature and the duration. The diffusion of the metal into the substrate gives rise to a solid bond of substrate and electrically conductive layer.

For the firing, an infrared furnace is typically used. However, it is also possible to use any other suitable furnace with which the temperatures needed for the firing can be established. It is also possible to use continuous furnaces, for example as tunnel furnaces, or batchwise furnaces.

In one embodiment of the invention, at least one metal layer is deposited on the structured or fully electrically conductive layer by electroless coating and/or electrocoating.

When the substrate is fired with the electrically conductive layer applied thereto, the electroless deposition and/or electrodeposition of the metal layer can be effected either before the firing or after the firing.

The coating can be effected by any process known to those skilled in the art. The composition of the electrolyte solution which is used for the coating depends on what metal is to be used to coat the electrically conductive layer on the substrate. Customary metals which are deposited by electroless coating and/or electrocoating on the electrically conductive layer are, for example, silver, gold, nickel, palladium, platinum or copper. The layer thicknesses of the one or more deposited layers are within customary ranges known to those skilled in the art.

Suitable electrolyte solutions which can be used to coat electrically conductive structures are known to those skilled in the art.

When the electrically conductive particles consist of materials which are oxidized easily, it may additionally be necessary to at least partly remove the oxide layer beforehand. According to the procedure in the process, for example in the case of use of acidic electrolyte solutions, the removal of the oxide layer may take place simultaneously with the metalization as it sets in, without an additional process step being required.

When the electrically conductive particles comprise a material which can oxidize easily, in a preferred process variant, the formation of the metal layer on the structured or fully electrically conductive layer is preceded by at least partial removal of the oxide layer. The oxide layer can be removed, for example, with acids, such as concentrated or dilute sulfuric acid or concentrated or dilute hydrochloric acid, nitric acid, citric acid, phosphoric acid, amidosulfonic acid, formic acid or acetic acid.

After the electrocoating, the substrate can be processed further by all steps known to those skilled in the art. For example, electrolyte residues present can be removed from the substrate by rinsing and/or the substrate can be dried.

In an alternative embodiment, at least one metal layer is first deposited onto the dried and/or hardened electrically conductive layer by electroless coating and/or electrocoating, and then the composite comprising the substrate with electrically conductive layer formed thereon, on which a further metal layer has been deposited, is fired.

The process according to the invention for producing electrically conductive layers on a substrate can be operated in continuous, semicontinuous or batchwise mode. It is also possible that only individual steps of the process are performed continuously, while other steps are performed batchwise.

In addition to the production of an electrically conductive layer, it is also possible by the process according to the invention to successively apply a plurality of layers to the substrate. For example, the performance of the process for producing the first conductive layer may be followed by a printing process as described above to apply at least one further structured or fully electrically conductive layer. The at least one further electrically conductive layer may, for example, comprise a different composition of electrically conductive particles. It is possible here, for example, that the proportion of electrically conductive particles in the dispersion is greater, that electrically conductive particles of another material or electrically conductive particles of the same materials but in another mixing ratio or with another particle geometry, are used for the further electrically conductive layer.

After generating an electrically conductive layer on one side of the substrate, it is possible to apply the dispersion either on the topside or on the bottomside of the substrate to form the electrically conductive layer. In this case, electrically conductive layers both for frontside contact connection and for backside contact connection of solar cells are obtained.

One embodiment of the invention is shown in the sole drawing and is explained in detail in the description which follows.

BRIEF DESCRIPTION OF THE DRAWING

The sole FIGURE shows a schematic of an apparatus for performing the process according to the invention.

DESCRIPTION OF PREFERRED EMBODIMENT

To produce electrodes for solar cells, a substrate 1 is supplied to a coating device 5 with a transport device 3 which is shown here only schematically. Suitable transport devices 3 are any desired transport devices known to those skilled in the art. For example, the transport device 3 may comprise a belt on which the substrate 1 is positioned and which is conducted around rollers in order to move the substrate 1. Alternatively, for example, it is possible to use feeders with which the substrate 1 is positioned in the coating device 5. It is also possible to use any other suitable transport device known to those skilled in the art.

The coating device 5 comprises a carrier 7 which is coated with a dispersion. In order to coat the substrate 1, the carrier 7 coated with the dispersion is irradiated with a laser 9. This detaches the dispersion from the carrier 7 and transfers it to the substrate 1. This is done, for example, by evaporating a small amount of the solvent which is present in the dispersion, and the generation of a shockwave in the dispersion, which subsequently generates a droplet which is detached from the carrier.

The dispersion applied to the substrate 1 comprises electrically conductive particles. In this way, an electrically conductive layer is obtained on the substrate 1. As well as the electrically conductive particles, it is also possible for binders present to be transferred from the dispersion to the substrate 1. A layer forms on the substrate 1, which comprises both particles and binders. The dispersion is transferred from the carrier 7 to the substrate 1, for example, in the form of droplets 11.

A structured coating can be obtained on the substrate 1 by, for example, using a mask. It is preferably also possible to achieve the structuring by shifting the laser, in which case the laser is simultaneously switched on and off depending on the structure. This can be done, for example, by means of an acousto-optical modulator or pulsing of the laser. Depending on the diameter of the laser beam which hits the carrier 7, it is also possible to obtain very fine structures with dimensions of less than 120 μm. The layer thickness is preferably in the range between 0.01 and 50 μm.

In the embodiment shown in FIG. 1, the carrier 7 is conducted by means of internal rollers 13. The motion of the carrier 7 is shown by an arrow 15.

Since the dispersion is no longer applied over the full surface of the carrier 7 after the application of the coating to the substrate 1, it is necessary to coat the carrier 7 with the dispersion again after the application of the coating to the substrate 1. For this purpose, a reservoir vessel 17 which comprises the dispersion is provided. In the embodiment shown here, a roller 19 is immersed into the reservoir vessel 17. An application roller 21 is used to apply the dispersion to the carrier 7. In order to remove the unused dispersion on the carrier when recoating, it is necessary that the application roller 21 moves counter to the carrier 7. The application roller 21 may, for example, have a structure such that the dispersion is applied to the carrier 7 in structured form. In this case, there is likewise structured application to the substrate 1. In general, the dispersion is, however, applied over the full surface to the carrier 7.

Alternatively to the embodiment shown here, in which the dispersion is applied to the carrier 7 with the aid of a roller application process, it is also possible to use any desired other application process, for example screenprinting, gravure printing, inkjet printing or flexographic printing.

After the transfer of the dispersion to the substrate 1 with the aid of the laser 9, the coating thus obtained is dried or hardened. After the hardening, it is possible to metalize the coating on the substrate 1 electrolessly or by electrocoating. The further process steps are carried out in apparatuses suitable for this purpose. To this end, the substrate 1, for example, is moved into a further treatment unit by the transport device 3. This is shown by an arrow 23.

LIST OF REFERENCE NUMERALS

1 Substrate
3 Transport device
5 Coating device
7 Carrier
9 Laser
11 Droplets
13 Roller
15 Movement of the carrier
17 Reservoir vessel
19 Roller
21 Application roller
23 Transport of the substrate

The invention claimed is:
1. A process for producing an electrode for a solar cell, the process comprising:
   a) transferring a dispersion comprising electrically conductive particles from a carrier to a substrate by irradiating the dispersion with a laser,
   b) drying, hardening, or both drying and hardening the dispersion which has been transferred to the substrate, to form an electrically conductive layer,
   wherein the electrode is configured as the electrically conductive layer on the substrate for the solar cell.

2. The process according to claim 1, wherein the transferring in a) is preceded by applying the dispersion to the carrier.

3. The process according to claim 2, wherein the dispersion is applied to the carrier by a coating process.

4. The process of claim 3, wherein the coating process is a printing, casting, rolling, or spraying process.

5. The process according to claim 3, further comprising at least one operation selected from the group consisting of stirring, pumping in circulation, and heat treating the dispersion in a reservoir vessel before the applying to the carrier.

6. The process according to claim 2, further comprising at least one operation selected from the group consisting of stirring, pumping in circulation, and heat treating the dispersion in a reservoir vessel before application to the carrier.

7. The process according to claim 1, wherein the laser is a solid-state laser, a fiber laser, a diode laser, a gas laser, or an excimer laser.

8. The process according to claim 1, wherein the laser generates a laser beam with a wavelength in a range from 150 to 10 600 nm.

9. The process according to claim 1, wherein the electrically conductive particles comprise at least one selected from the group consisting of a metal and carbon.

10. The process according to claim 9, wherein the electrically conductive particles comprise a metal selected from the group consisting of aluminum, silver, copper, nickel, titanium, platinum, and palladium.

11. The process according to claim 1, wherein the electrically conductive particles have different particle geometries.

12. The process according to claim 1, wherein the dispersion comprises an absorbent.

13. The process according to claim 12, wherein the absorbent is carbon or lanthanum hexaboride.

14. The process according to claim 1, wherein the dispersion comprises a glass frit.

15. The process according to claim 1, wherein the electrically conductive layer, after drying, hardening, or both drying and hardening, is subjected to electroless coating, electrocoating, or both electroless coating and electrocoating.

16. The process according to claim 15, wherein the electroless coating, the electrocoating, or both the electroless coating and the electrocoating of the electrically conductive layer is preceded by removing an oxide layer, which is optionally present, from the electrically conductive particles.

17. The process according to claim 1, wherein the electrically conductive layer is fired.

18. The process according to claim 1, wherein the dispersion is applied to a topside and a bottomside of the substrate to form the electrically conductive layer.

19. The process according to claim 1, wherein the carrier is a rigid or flexible plastic or glass which is transparent to the laser.

* * * * *

UNITED STATES PATENT AND TRADEMARK OFFICE
Certificate

Patent No. 8,247,320 B2　　　　　　　　　　　　　　　　　　　　　　　　　　Patented: August 21, 2012

On petition requesting issuance of a certificate for correction of inventorship pursuant to 35 U.S.C. 256, it has been found that the above identified patent, through error and without any deceptive intent, improperly sets forth the inventorship.

Accordingly, it is hereby certified that the correct inventorship of this patent is: Rene Lochtman, Mannheim (DE); Norbert Wagner, Mutterstadt (DE); Jurgen Kaczun, Wachenheim (DE); Jurgen Pfister, Speyer (DE); and Udo Lehmann, Waldalgesheim (DE).

Signed and Sealed this Sixteenth Day of April 2013.

MATTHEW W. SUCH
*Supervisory Patent Examiner*
Art Unit 2896
Technology Center 2800